(12) United States Patent
Akamatsu (10) Patent No.: US 6,680,868 B2
(45) Date of Patent: Jan. 20, 2004

(54) NONVOLATILE SEMICONDUCTOR STORAGE DEVICE AND CONTROL METHOD THEREOF

(75) Inventor: Toshihiro Akamatsu, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/044,706

(22) Filed: Jan. 11, 2002

(65) Prior Publication Data
US 2002/0105829 A1 Aug. 8, 2002

(30) Foreign Application Priority Data
Feb. 6, 2001 (JP) ....................................... 2001-029765

(51) Int. Cl.$^7$ ................................................ G11C 7/00
(52) U.S. Cl. .................................... 365/189.04; 365/233
(58) Field of Search .................................. 365/236, 204, 365/228, 218, 239, 233, 189.07, 189.04

(56) References Cited

U.S. PATENT DOCUMENTS

| | | | | |
|---|---|---|---|---|
| 5,801,985 A | * | 9/1998 | Roohparvar et al. | ... 365/185.01 |
| 5,880,996 A | * | 3/1999 | Roohparvar | ............ 365/185.33 |
| 5,943,263 A | * | 8/1999 | Roohparvar | ............ 365/185.17 |
| 6,392,928 B1 | * | 5/2002 | Roohparvar | ............ 365/185.18 |

FOREIGN PATENT DOCUMENTS

| | | |
|---|---|---|
| JP | 02-010596 | 1/1990 |

* cited by examiner

*Primary Examiner*—Thong Le
(74) *Attorney, Agent, or Firm*—Morrison & Foerster LLP (57) ABSTRACT

As soon as a write command is input to a nonvolatile memory cell array, an internal charge pump circuit starts pumping. When the pumping is achieved, the writing to the nonvolatile memory cell array is implemented. By keeping the internal charge pump circuit ready for a next write command even after the end of the first write operation, it is possible to cut down the time required for the activation/deactivation of the internal charge pump circuit, which would cause redundancy. When it is determined that no successive write operations are to be performed, the internal charge pump circuit is deactivated. Similar controls are carried out for the other commands which rewrite the contents of the nonvolatile memory cell array.

12 Claims, 7 Drawing Sheets

NONVOLATILE SEMICONDUCTOR STORAGE DEVICE AND CONTROL METHOD THEREOF

BACKGROUND OF THE INVENTION (1) Field of the Invention

The present invention relates to a nonvolatile semiconductor storage device and its control method, and in particular relates to a nonvolatile semiconductor storage device which enables electric writing and erasing of data and its control method.

(2) Description of the Prior Art

Conventionally, in the access scheme for nonvolatile semiconductor storage devices enabling electric writing and erasing of data, typically represented by flash memories, data reading is performed by using a dedicated control terminal or terminals, as is performed by a volatile memory such as a DRAM (Dynamic Random Access Memory) and SRAM (Static Random Access Memory) or a non-volatile memory such as ROM (Read only Memory). On the other hand, concerning data writing and erasing of memory cells, usually no dedicated control terminal is provided, but commands indicating data writing and erasing operations are input externally to perform the necessary operation, instead.

Such a data erasing and programming (data writing) method based on command control for use in an electrically rewritable and erasable nonvolatile semiconductor storage device has been disclosed in detail by Japanese Patent Publication Hei 6 No.32226.

As in Japanese Patent Publication Hei 6 No.32226, an input command is usually constructed of multiple cycles accompanying activation of each chip enable signal, such as set-up erase and erase commands.

Figure 1:
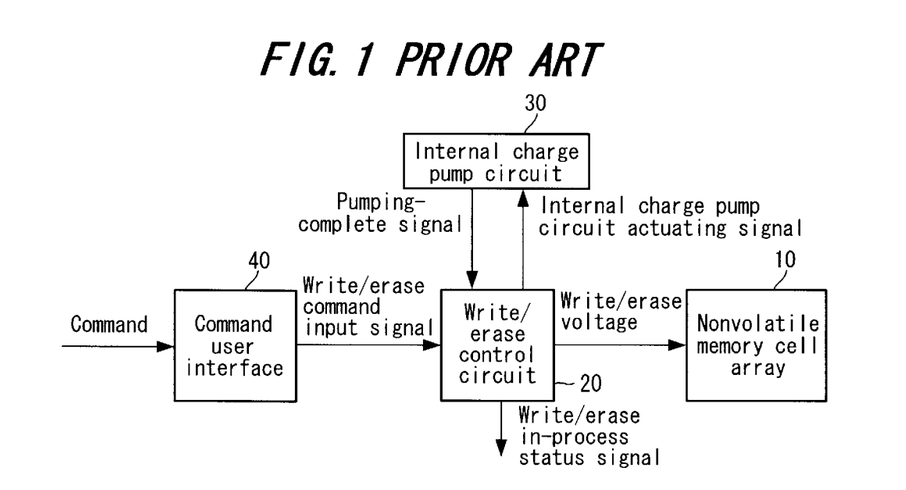
FIG. 1 is a block diagram showing a circuit configuration of a typical nonvolatile semiconductor storage device.
Figure 2:
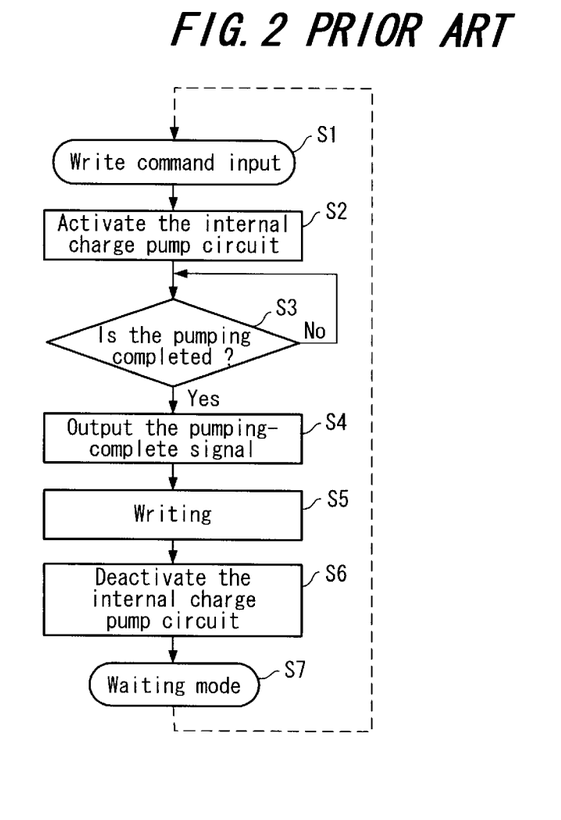
FIG. 2 is a flowchart showing a sequence of write operations implemented in succession in a conventional nonvolatile semiconductor storage device.

Referring now to FIG. 1, circuit blocks in a typical nonvolatile semiconductor storage device will be described. FIG. 2 shows a flowchart for illustrating the internal operation of this circuit configuration when write operations are performed in succession. The nonvolatile semiconductor storage device shown in FIG. 1 has the same structure as that of the nonvolatile semiconductor storage device according to the first embodiment of the present invention to be detailed hereinbelow.

In FIG. 2, though only data write operations are described, the internal operation when a data erase operation is performed is equivalent to that shown in FIG. 2 except that 'write' is replaced by 'erase'.

As shown in FIG. 1, the conventional nonvolatile semiconductor storage device is comprised of a nonvolatile memory cell array 10 made up of a multiple number of memory cell transistors (not shown), a write/erase control circuit 20, an internal charge pump circuit 30 and a command user interface 40 for interpreting the commands input externally.

Interval charge pump circuit 30 is a circuit which pumps the voltage supplied externally to such a level as to be able to change the threshold of the memory cell transistors in nonvolatile memory cell array 10 (so as to be able to perform data writing or data erasing).

Write/erase control circuit 20 is a circuit for making the write/erase in-process status signal active based on a write/erase command input signal through command user interface 40 so as to indicate that a write operation or erase operation has started (has been in progress) and actuating the operation of internal charge pump circuit 30 by making active the actuating signal to internal charge pump circuit 30 in order to obtain the necessary voltage for implementing the write/erase operation of the memory cell (for changing the threshold of the memory cell transistor).

Write/erase control circuit 20, in response to the pumping-complete signal from internal charge pump circuit 30, performs the write/erase operation to nonvolatile memory cell array 10, using the pumping write/erase voltage. When a write/erase operation has been completed, the actuating signal for internal charge pump circuit 30 output from write/erase control circuit 20 is made inactive so as to stop the operation of internal charge pump circuit 30 while the write/erase in-process status signal is made inactive to thereby indicate that the write or erase operation has been completed.

In the nonvolatile semiconductor storage device having the above circuit configuration, once a write command is input to the nonvolatile semiconductor storage device (S1), write/erase control circuit 20 turns on internal charge pump circuit 30 (S2), as shown in FIG. 2.

Then, internal charge pump circuit 30 starts the pumping operation and continues it until the pumping reaches a specified voltage (S3). When the specified voltage has been reached, the pumping-complete signal is returned to write/erase control circuit 20 (S4).

Subsequently, write/erase control circuit 20 implements writing of data into nonvolatile memory cell array 10, using the pumping voltage (S5).

When the write operation has been completed, internal charge pump circuit 30 is turned off (S6). That is, the pumping voltage is reduced and the waiting mode is restored so as to be able to accept a new command to implement (S7).

When another write command is input in succession, the same operation will be started once again (S1 to S7).

Up to now, the internal operation for data writing has been described, but the internal operation for data erasing is also performed in the same sequence as above. In this case, the internal operation for data erasing is equivalent to that shown in FIG. 2 where 'write' is replaced by 'erase'.

Since the conventional nonvolatile semiconductor storage device is thus configured, it includes the following problems.

In the conventional nonvolatile semiconductor storage device, if write commands or erase commands are input in succession, internal charge pump circuit 30 performs the pumping-off operation every end of write or erase operation. This is because the conventional nonvolatile semiconductor storage device has no means for distinguishing the relationship between the command being currently implemented and the command to be input next. Further, since a different pumping voltage is needed for a different command, the charge pump circuit needs to be initialized in preparation for a next input of a different command.

Incidentally, nonvolatile semiconductor storage devices, typified by flash memories, have usually been used as rewritable read only memory after they have been mounted on product boards. Therefore, the above configuration did not pose any inconvenience.

However, with the recent development of flash memories into large capacities, their improvement in reliability and the broadening of their application fields, the nonvolatile semiconductor storage devices have become used for data recording purposes involving filesystems, which need frequent write and erase operations, similarly to the way the magnetic storage devices are used. Further, since the data to be handled by nonvolatile semiconductor storage devices has become large in scale, as typified by audio data, write and erase operations have become more frequently implemented in succession.

For the above reasons, the redundancy of operations when write or erase commands are input in succession, i.e., restarting pumping after once turning the charge pump circuit off, can be no longer disregarded. More specifically, the control method of the conventional nonvolatile semiconductor storage devices suffers the problem of increased total time for writing or erasing and increased power consumption.

Under such circumstances, there have been demands for a method which is capable of omitting part of the internal operation that becomes redundant when write or erase commands are input in succession, by providing a means of distinguishing the types of commands input in row and hence can reduce the time of write and/or erase operations and cut down the power consumption.

SUMMARY OF THE INVENTION

The present invention has been devised under the above circumstances, it is therefore an object of the present invention to provide a nonvolatile semiconductor storage device and its control method, wherein the time required for write or erase operations to be implemented in succession can be cut down.

In order to achieve the above object, the nonvolatile semiconductor storage device and its control method of the present invention are configured as follows:

In accordance with the first aspect of the present invention, a nonvolatile semiconductor storage device includes: a memory cell array made up of a multiple number of nonvolatile memory cells; a charge pump circuit for generating voltages for data writing and erasing of memory cells; a command user interface for interpreting a command externally input and generating a signal instructing execution of the command; and a write and erase control circuit which receives the signal from the command user interface and controls a series of internal operations constituting writing and erasing of data in the memory cell array so as to supply the voltage generated by the charge pump circuit to the memory cell array, and is characterized in that the command user interface includes a successive command input detecting means for detecting the successive inputs of commands of the same type, and when the successive command input detecting means detects commands of the same type in succession, the write and erase control circuit functions so as to control the internal operations by skipping part of the sequence of the internal operations constituting the input, first command operation and starting execution of the second command before the first command has been completed.

In accordance with the second aspect of the present invention, the nonvolatile semiconductor storage device having the above first feature is characterized in that the successive command input detecting means of the command user interface comprises: a storage means for storing the type of an input command; a comparing means for comparing the type of a command input next to that of the stored command; and an output means for outputting the comparison result in the comparing means.

In accordance with the third aspect of the present invention, the nonvolatile semiconductor storage device having the above first feature is characterized in that the externally input commands are made up of multiple cycles, and comparison by the command user interface between the first and second commands as to command type is carried out during the first cycle of the second command.

In accordance with the fourth aspect of the present invention, the nonvolatile semiconductor storage device having the above second feature is characterized in that the externally input commands are made up of multiple cycles, and comparison by the command user interface between the first and second commands as to command type is carried out during the first cycle of the second command.

In accordance with the fifth aspect of the present invention, a control method of a nonvolatile semiconductor storage device comprising: a memory cell array made up of a multiple number of nonvolatile memory cells; a charge pump circuit for generating voltages for data writing and erasing of memory cells; a command user interface for interpreting a command externally input and generating a signal instructing execution of the command; and a write and erase control circuit which receives the signal from the command user interface and controls a series of internal operations constituting writing and erasing of data in the memory cell array so as to supply the voltage generated by the charge pump circuit to the memory cell array, wherein the command user interface includes a successive command input detecting means for detecting the successive inputs of commands of the same type, and when the successive command input detecting means detects commands of the same type in succession, the write and erase control circuit functions so as to control the internal operations by skipping part of the sequence of the internal operations constituting the input, first command operation and starting execution of the second command before the first command has been completed, includes: the first step of activating the charge pump circuit for pumping the output voltage therefrom to a predetermined voltage; the second step of setting the threshold voltage of the memory cell transistor at a predetermined level, by applying the pumping voltage generated at the first step; and the third step of deactivating the operation of the charge pump circuit so as to restore the output voltage to the initial state, and is characterized in that when the second command being input during implementation of the first command is of the same type as that of the first command, the second step of the execution of the second command is started following the end of the second step of the execution of the first command.

In accordance with the sixth aspect of the present invention, a nonvolatile semiconductor storage device includes: a memory cell array made up of a multiple number of nonvolatile memory cells; a charge pump circuit for generating voltages for data writing and erasing of memory cells; a command user interface for interpreting a command externally input and generating a signal instructing execution of the command; a write and erase control circuit which receives the signal from the command user interface and controls a series of internal operations constituting writing and erasing of data in the memory cell array so as to supply the voltage generated by the charge pump circuit to the memory cell array; and a means for receiving a successive operation control signal which indicates that a command of the same type as that of the preceding command has been externally input in succession, and is characterized in that the write and erase control circuit distinguishes the status of the successive operation control signal, and when the successive operation control signal is active, the write and erase control circuit functions so as to control the internal operations by skipping part of the sequence of the internal operations constituting the input, first command operation and starting execution of the second and following commands input in succession before the preceding command has been completed.

In accordance with the seventh aspect of the present invention, the nonvolatile semiconductor storage device having the above sixth feature further includes a dedicated external terminal through which the successive operation control signal is supplied.

In accordance with the eighth aspect of the present invention, the nonvolatile semiconductor storage device having the above sixth feature further includes a means for generating the successive operation control signal from the chip-select signal input externally.

In accordance with the ninth aspect of the present invention, a control method of a nonvolatile semiconductor storage device comprising: a memory cell array made up of a multiple number of nonvolatile memory cells; a charge pump circuit for generating voltages for data writing and erasing of memory cells; a command user interface for interpreting a command externally input and generating a signal instructing execution of the command; a write and erase control circuit which receives the signal from the command user interface and controls a series of internal operations constituting writing and erasing of data in the memory cell array so as to supply the voltage generated by the charge pump circuit to the memory cell array; and a means for receiving a successive operation control signal which indicates that a command of the same type as that of the preceding command has been externally input in succession, wherein the write and erase control circuit distinguishes the status of the successive operation control signal, and when the successive operation control signal is active, the write and erase control circuit functions so as to control the internal operations by skipping part of the sequence of the internal operations constituting the input, first command operation and starting execution of the second command and following commands input in succession before the preceding command has been completed, includes: the first step of activating the charge pump circuit for pumping the output voltage therefrom to a predetermined voltage; the second step of setting a threshold voltage of the memory cell transistor at the predetermined level, by applying the pumping voltage generated at the first step; and the third step of deactivating the operation of the charge pump circuit so as to restore the output voltage to the initial state, and is characterized in that when the successive operation control signal is active, the second step of the execution of the second command is started following the end of the second step of the execution of the first command.

In accordance with the tenth aspect of the present invention, a nonvolatile semiconductor storage device includes: a memory cell array made up of a multiple number of nonvolatile memory cells; a charge pump circuit for generating voltages for data writing and erasing of memory cells; a command user interface for interpreting a command externally input and generating a signal instructing execution of the command; a write and erase control circuit which receives the signal from the command user interface and controls a series of internal operations constituting writing and erasing of data in the memory cell array so as to supply the voltage generated by the charge pump circuit to the memory cell array; and a timer circuit, and is characterized in that the write and erase control circuit has the function of setting the count time in the timer circuit and controlling the count start, and the timer circuit has the function of controlling the activation and deactivation of the operation of the charge pump circuit.

In accordance with the eleventh aspect of the present invention, the nonvolatile semiconductor storage device having the above tenth feature is characterized in that in the timer circuit the count time of waiting for a command of the same type to be externally input in succession can be adjusted arbitrarily.

In accordance with the twelfth aspect of the present invention, a control method of a nonvolatile semiconductor storage device comprising: a memory cell array made up of a multiple number of nonvolatile memory cells; a charge pump circuit for generating voltages for data writing and erasing of memory cells; a command user interface for interpreting a command externally input and generating a signal instructing execution of the command; a write and erase control circuit which receives the signal from the command user interface and controls a series of internal operations constituting writing and erasing of data in the memory cell array so as to supply the voltage generated by the charge pump circuit to the memory cell array; and a timer circuit, wherein the write and erase control circuit has the function of setting the count time in the timer circuit and controlling the count start, and the timer circuit has the function of controlling the activation and deactivation of the operation of the charge pump circuit, includes: the first step of activating the charge pump circuit to pumping the output voltage therefrom to a predetermined voltage; the second step of setting the threshold voltage of the memory cell transistor at a predetermined level, by applying the pumping voltage generated at the first step; and the third step of deactivating the operation of the charge pump circuit so as to restore the output voltage to the initial state, and is characterized in that when the second command is input while the timer circuit, which starts counting from the end of the second step of the execution of the first command, is counting up to the predetermined count time, the second step of the execution of the second command is started following the end of the second step of the execution of the first command.

According to the configuration of the present invention, it is possible to distinguish that successive commands of the same type, for example, successive write commands, have been input, so that redundant internal operations such as deactivation and restarting of the charge pump circuit, which would take place when successive commands have been input, can be avoided based on the determined result.

According to the configuration of the present invention, it is possible to determine whether the first command and the second command input subsequently is of the same type.

According to the configuration of the present invention, the type of the second command input subsequently can be determined from the first cycle of the command only. Therefore, the time required for the determination can be shortened hence the total operation time in the successive mode can be further cut down.

According to the configuration of the present invention, it is possible to omit deactivation and restarting of the charge pump circuit, which would take up much time when successive operations are to be made. Therefore, it is possible to markedly reduce the total operation time in the successive operation mode.

According to the configuration of the present invention, it is possible to readily identify the status in which successive commands of the same type, for example, successive write commands, have been input, so that redundant internal operations such as deactivation and restarting of the charge pump circuit, which would take place when successive commands have been input, can be avoided based on the determined result.

According to the configuration of the present invention, it is possible to obtain the successive operation control signal in a markedly simple manner.

According to the configuration of the present invention, it is possible to obtain the successive operation control signal without the necessity of any modification of the external terminal specifications of the conventional configuration.

According to the configuration of the present invention, it is possible to omit deactivation and restarting of the charge pump circuit, which would take up much time when successive operations are to be made. Therefore, it is possible to markedly reduce the total operation time in the successive operation mode.

According to the configuration of the present invention, when successive commands of the same type have been input within a certain fixed period of time, it is possible to readily avoid redundant internal operations such as deactivation and restarting of the charge pump circuit, which would take place in the successive operation mode.

According to the configuration of the present invention, it is possible to arbitrarily set the interval, based on which commands of the same type are input in succession.

According to the configuration of the present invention, when the interval of commands of the same type being input in succession is predetermined, it is possible to readily omit redundant deactivation and restarting of the charge pump circuit, which would take up much time when successive operations are to be made. Therefore, it is possible to markedly reduce the total operation time in the successive operation mode.

DESCRIPTION OF THE PREFERRED EMBODIMENTS

The embodiments of nonvolatile semiconductor storage devices and their control methods according to the present invention will hereinafter be described with reference to the accompanying drawings.

<The First Embodiment>

Figure 3:
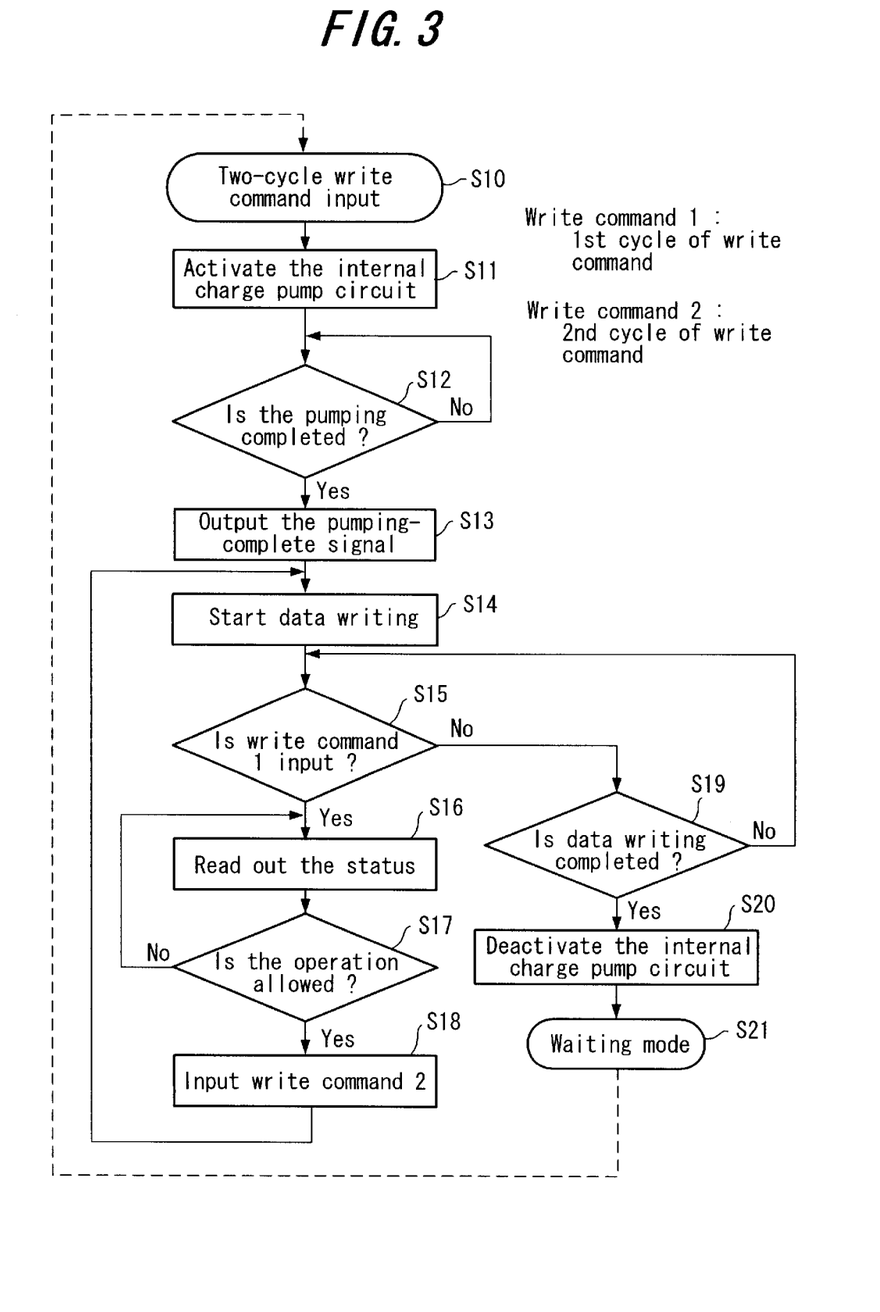
FIG. 3 is a flowchart showing a sequence of write operations implemented in succession in a nonvolatile semiconductor storage device according to the first embodiment of the present invention.

The nonvolatile semiconductor storage device according to the first embodiment of the present invention has the same circuit configuration as that shown in FIG. 1. FIG. 3 is a flowchart showing the internal operation when successive write operations are implemented in the nonvolatile semiconductor storage device shown in FIG. 1.

As shown in FIG. 1, the nonvolatile semiconductor storage device according to the first embodiment of the present invention is comprised of a nonvolatile memory cell array 10 made up of a multiple number of memory cell transistors (not shown), a write/erase control circuit 20, an internal charge pump circuit 30 and a command user interface 40 for interpreting the commands input externally.

The circuit configuration of the nonvolatile semiconductor storage device according to the first embodiment has almost the same configuration as described in the prior art, except in that command user interface 40 and write/erase control circuit 20 function in a different manner when a write or erase command is input externally.

Next, description will made of the internal operation of this nonvolatile semiconductor storage device according to the first embodiment when successive data write operations are to be performed.

In the description hereinbelow, a write command into the nonvolatile semiconductor storage device is assumed to be a two-cycle command.

In the nonvolatile semiconductor storage device according to the first embodiment, once a first, two-cycle write command is input to the nonvolatile semiconductor storage device (S10), the command user interface outputs the necessary signals for the write operation as a write/erase command input signal, as shown in FIG. 3.

Then, when receiving the write/erase command input signal, write/erase control circuit 20 actuates internal charge pump circuit 30 by turning on the actuating signal for internal charge pump circuit 30 so as to obtain the necessary voltage for write operation (S11).

At the same time, command user interface 40 latches the type of the input, first command (the write command in this case) in an internal latch circuit. Then internal charge pump circuit 30 starts pumpinging and continues it until the pumping reaches a specified voltage (S12). When the specified voltage has been reached, internal charge pump circuit 30 outputs a pumping-complete signal to write/erase control circuit 20 (S13).

Subsequently, when receiving the pumping-complete signal, write/erase control circuit 20 starts the writing into nonvolatile memory cell array 10 and supplies the pumping, write/erase voltage from internal charge pump circuit 30, to nonvolatile memory cell array 10 (S14).

Then, when a next, second command is input before completion of the current writing operation, the command user interface distinguishes the command type from the first cycle of the second command and compares it with the type (the write command in this case) held at the aforementioned latch circuit (S15).

If the two are of the same command type (Yes at S15), the interface outputs a signal representing that write commands have been input in succession, as the write/erase command input signal. When receiving the write/erase command input signal, write/erase control circuit 20 makes ready for the second write operation, instead of deactivating the operation of internal charge pump circuit 30.

When the second command is of a write command, the external CPU reads out the status of the nonvolatile semiconductor storage device (the write/erase in-process status signal output from write/erase control circuit 20) (S16) and checks if writing is allowed (the preceding write operation has been completed) (S17).

Here, if writing is not allowed (or when the write/erase in-process status signal is active), the external CPU continues to get hold of the first cycle of the write command to check the status until writing is allowed (the write/erase in-process status signal becomes inactive).

When the external CPU receives the second cycle of the write command after the write permitted status has been detected (S18), the command user interface 40 outputs the necessary signals for the write operation as the write/erase command input signal. Write/erase control circuit 20, as soon as it receives the write/erase command input signal, controls the internal operation so as to start the second write operation into nonvolatile memory cell array 10.

Thereafter, if a further successive write operation takes place, the above sequence should be repeated.

When no successive write command is input before the current write operation is completed (No at S15), the end of the current write operation is waited for (S19).

When the current write operation has ended, write/erase control circuit 20 makes the actuating signal of internal charge pump circuit 30 inactive so as to stop the operation of internal charge pump circuit 30 (S20). In this state, the nonvolatile semiconductor storage device is set into the waiting mode (S21) so that the series of successive write operations terminates.

In connection to the above operation sequence, the distinction by command user interface 40 of the type of an input command can be performed, for example, by regarding the data of the first cycle of the command as a bit sequence and decoding it in an appropriate manner.

Up to now, the description has been made of the nonvolatile semiconductor storage device and its control method involving two-cycle write commands, but if the commands are of three or more cycles, the object of the present invention can be achieved by distinguishing the type of the second command using its first cycle.

<The Second Embodiment>

Next, the nonvolatile semiconductor storage device and its control method according to the second embodiment of the present invention will be described.

Figure 4:
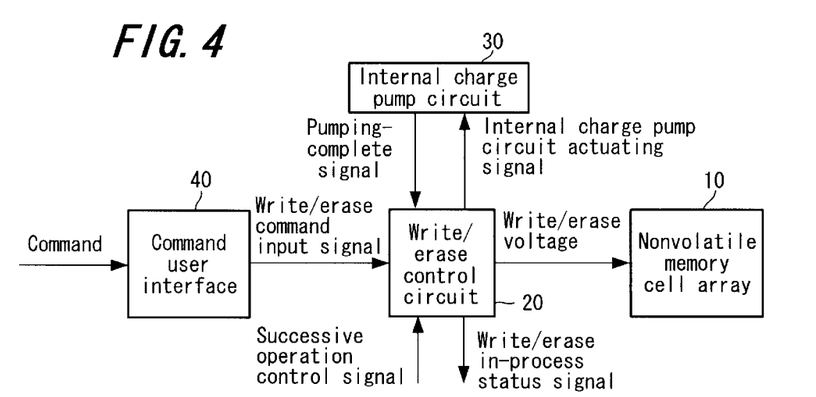
FIG. 4 is a block diagram showing a circuit configuration of a nonvolatile semiconductor storage device according to the second embodiment of the present invention.
Figure 5:
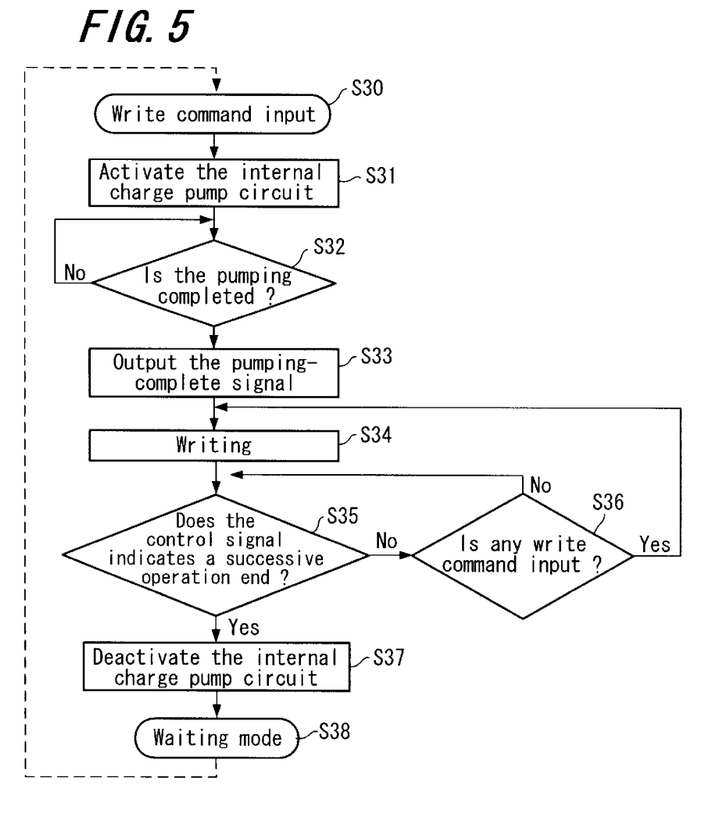
FIG. 5 is a flowchart showing a sequence of write operations implemented in succession in a nonvolatile semiconductor storage device according to the second embodiment of the present invention.

FIG. 4 is a block diagram showing a circuit configuration of the nonvolatile semiconductor storage device according to the second embodiment of the present invention. FIG. 5 is a flowchart showing the internal operation when successive write operations are implemented in the nonvolatile semiconductor storage device shown in FIG. 4.

The nonvolatile semiconductor storage device according to the second embodiment of the present invention has almost the same configuration as that of the first embodiment. The difference from the nonvolatile semiconductor storage device according to the first embodiment described above is that a successive operation control signal is input to write/erase control circuit 20, as shown in FIG. 4. Accordingly, the circuits having the same functions as that in the nonvolatile semiconductor storage device according to the first embodiment are allotted with the same reference numerals without description.

The successive operation control signal input to write/erase control circuit 20 plays a role of determining the subsequent operation of internal charge pump circuit 30. Generation of this successive operation control signal will be described later.

Next, description will be made of the internal operation of this nonvolatile semiconductor storage device according to the second embodiment when successive data write operations are to be performed.

In the nonvolatile semiconductor storage device according to the second embodiment, once a write command is input to the nonvolatile semiconductor storage device (S30), command user interface 40 outputs the necessary signals for the write operation as a write/erase command input signal, as shown in FIG. 5.

Then, when receiving the write/erase command input signal, write/erase control circuit 20 turns on the actuating signal for internal charge pump circuit 30 so as to request the internal charge pump circuit 30 to start pumping (S31).

Then, internal charge pump circuit 30 starts pumping and continues it until the pumping reaches a specified voltage (S32). When the specified voltage has been reached, the internal charge pump circuit 30 outputs a pumping-complete signal to write/erase control circuit 20 (S33).

Subsequently, when receiving the pumping-complete signal, write/erase control circuit 20 starts the writing into nonvolatile memory cell array 10 and supplies the pumping, write/erase voltage from internal charge pump circuit 30, to nonvolatile memory cell array 10 (S34).

When the writing into nonvolatile memory cell array 10 is completed, write/erase control circuit 20 checks the status of the successive operation control signal (S35). Unless the status of the current state is that in which the successive operation has been terminated, the write/erase control circuit keeps the pumping condition of internal charge pump circuit 30 as is and waits (in the loop of S35 and S36).

When the successive operation has been terminated, the actuating signal of internal charge pump circuit 30 is made inactive so as to deactivate the operation of internal charge pump circuit 30 (S37) and the nonvolatile semiconductor storage device is set into the waiting mode (S38).

If another write command is input during the successive operation waiting mode, this writing command into nonvolatile memory cell array 10 can be immediately implemented (by controlling the operation returning from S36 to S34) because the pumping has been already reached.

Here, the successive operation control signal can be received by providing an extra control terminal for the nonvolatile semiconductor storage device. It is also possible to receive the successive operation control signal by sharing the terminal for the chip enable signal etc., without modification of the terminal specifications.

In the case where the successive operation control signal is received using the terminal common to the chip enable signal, the chip enable signal needs to be fixed at its active state while write commands are being input in succession. Fixing the chip enable signal at its active state is an often used method, so that there is no concern of the external control circuit being markedly complicated because of this purpose.

<The Third Embodiment>

Next, the nonvolatile semiconductor storage device and its control method according to the third embodiment of the present invention will be described.

Figure 6:
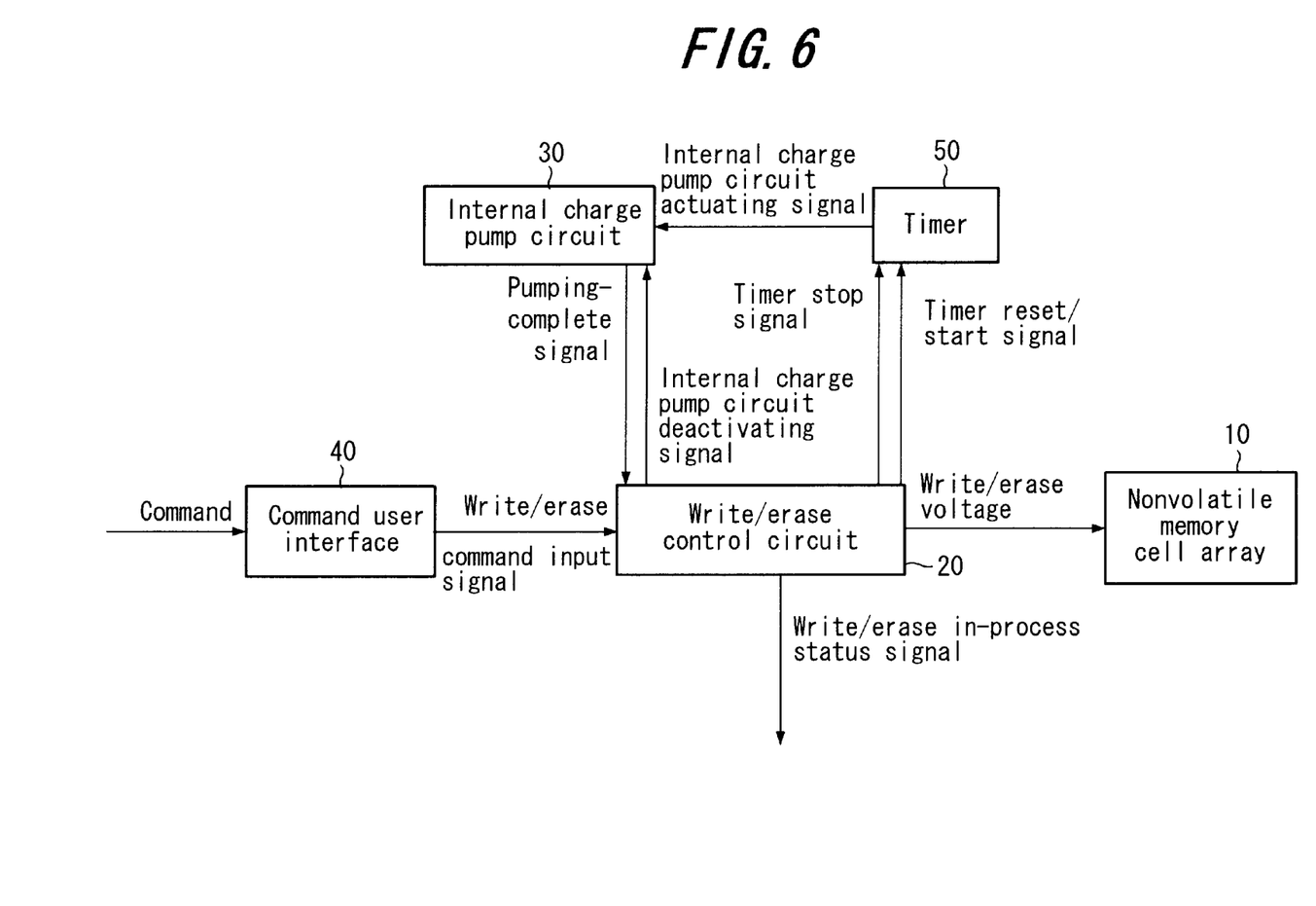
FIG. 6 is a block diagram showing a circuit configuration of a nonvolatile semiconductor storage device according to the third embodiment of the present invention.
Figure 7:
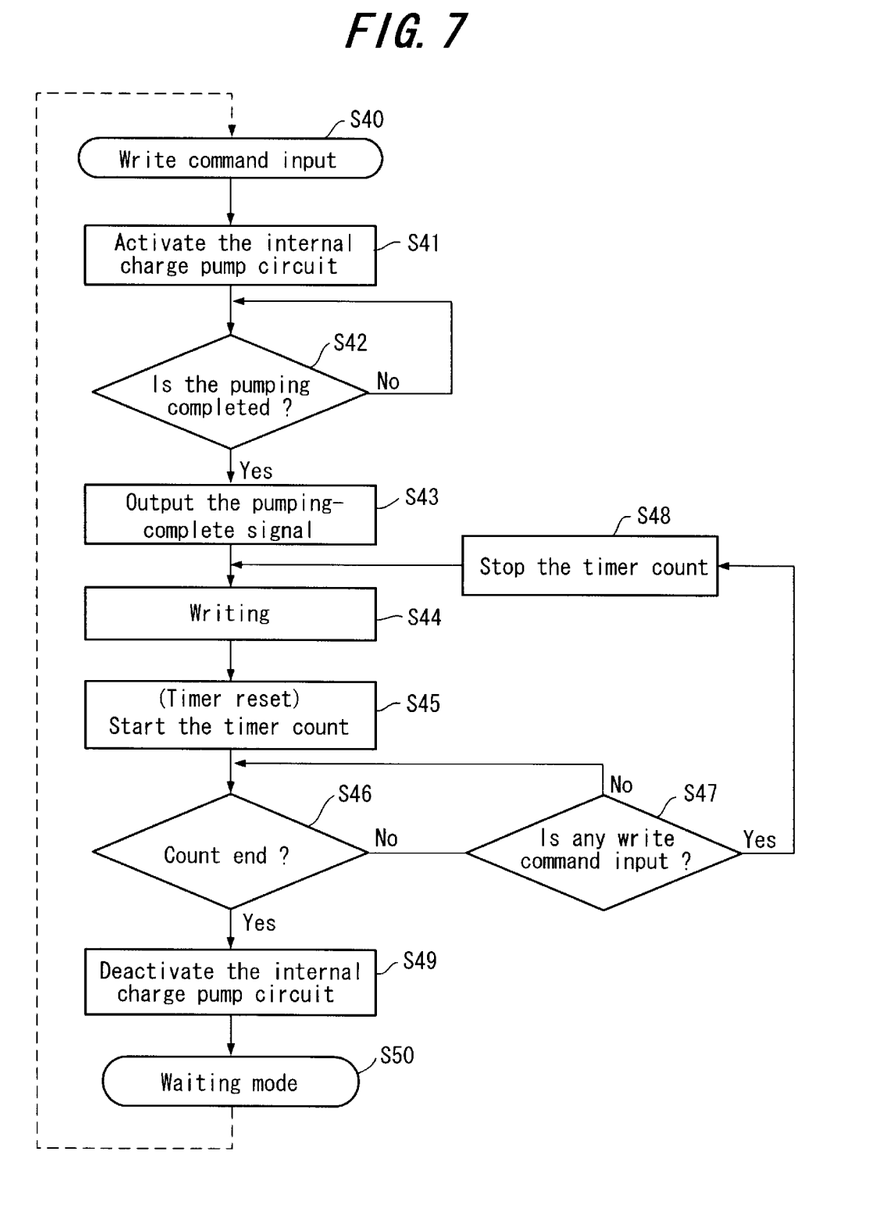
FIG. 7 is a flowchart showing a sequence of write operations implemented in succession in a nonvolatile semiconductor storage device according to the third embodiment of the present invention.

FIG. 6 is a block diagram showing a circuit configuration of the nonvolatile semiconductor storage device according to the third embodiment of the present invention. FIG. 7 is a flowchart showing the internal operation when successive write operations are implemented in the nonvolatile semiconductor storage device shown in FIG. 6.

The nonvolatile semiconductor storage device of the third embodiment includes a timer circuit 50, in addition to the circuit configuration of the nonvolatile semiconductor storage device of the first embodiment so as to achieve the object of the present invention using the accessing method identical to the conventional method.

The nonvolatile semiconductor storage device according to the third embodiment of the present invention, as shown in FIG. 6, has almost the same configuration as that of the first embodiment, except in that timer circuit 50 is added therein. Therefore, the circuits having the same functions as that in the nonvolatile semiconductor storage device according to the first embodiment are allotted with the same reference numerals without description.

The circuit and signals added in the nonvolatile semiconductor storage device according to the third embodiment will be described.

Timer circuit 50 is a counter circuit for counting the preset time and the count of the timer is reset and started by the timer reset/start signal. The timer circuit outputs a deactivating signal to internal charge pump circuit 30 when the preset time has been counted. The timer stop signal is to stop the counting of the timer so that timer circuit 50 will not output the deactivating signal to internal charge pump circuit 30.

Next, description will be made of the internal operation of this nonvolatile semiconductor storage device according to the third embodiment when successive data write operations are to be performed.

In the nonvolatile semiconductor storage device according to the third embodiment, once a write command is input to the nonvolatile semiconductor storage device (S40), command user interface 40 outputs the necessary signals for the write operation as a write/erase command input signal, as shown in FIG. 7.

Then, when receiving the write/erase command input signal, write/erase control circuit 20 makes the actuating signal for internal charge pump circuit 30 active so as to request the internal charge pump circuit 30 to start pumping (S41).

Then, internal charge pump circuit 30 starts pumping and continues it until the pumping reaches a specified voltage (S42). When the specified voltage has been reached, the internal charge pump circuit 30 outputs a pumping-complete signal to write/erase control circuit 20 (S43).

Subsequently, when receiving the pumping-complete signal, write/erase control circuit 20 starts the writing into nonvolatile memory cell array 10 and supplies the pumping, write/erase voltage from internal charge pump circuit 30, to nonvolatile memory cell array 10 (S44).

When the writing into nonvolatile memory cell array 10 is completed, write/erase control circuit 20 resets the count value on timer circuit 50 and starts counting (S45).

Thereafter, when another write command is input before the preset time has elapsed (S46 and S47), write/erase control circuit 20 actuates the timer stop signal to thereby stop the count on the timer (S48) and immediately performs the writing into nonvolatile memory cell array 10 and then resets and restarts the timer again after completion of the write operation.

On the other hand, when the count on the timer has reached its limit, timer circuit 50 then considers that no write command has been input in succession and deactivates internal charge pump circuit 30 (S49) so that the nonvolatile semiconductor storage device is set into the waiting mode (S50).

The set time in timer circuit 50 may and should be marginally longer than the time required for one command of writing. In other words, the time set in timer circuit 50 is determined based on the sum of the polling (readout) time of the status information indicating the completion of the in-process operation and the actual time for implementing of the write operation command.

Figure 8:
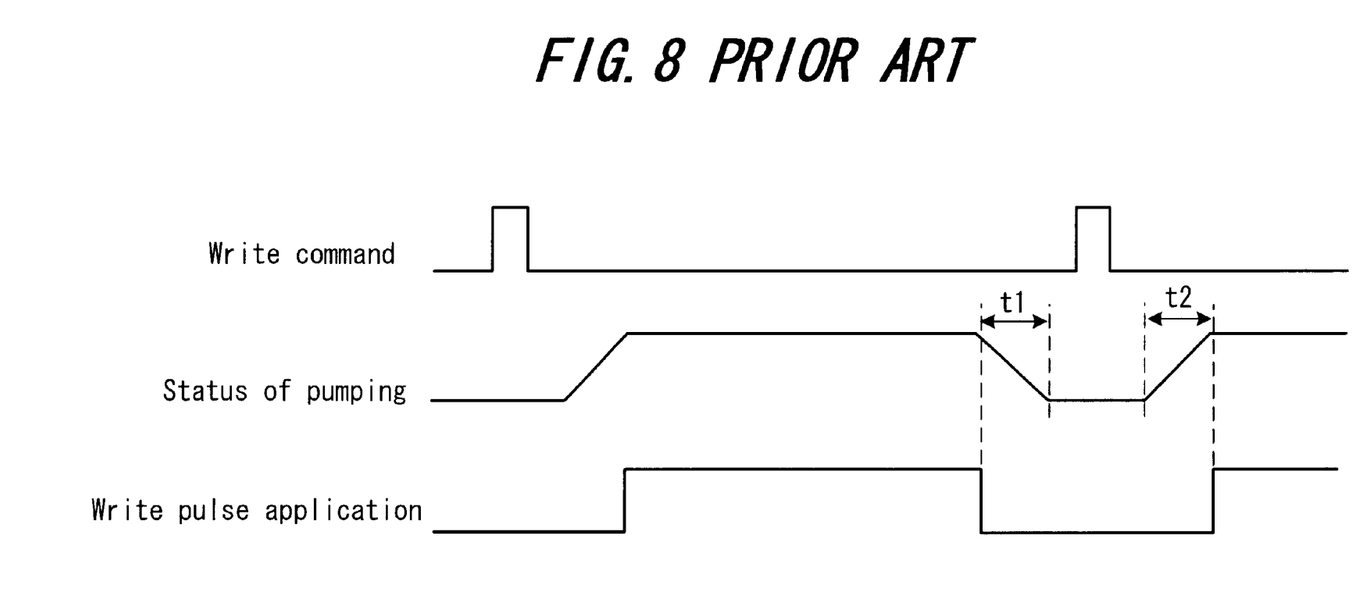
FIG. 8 is a timing chart when write operations of data are performed in succession to a nonvolatile memory array, in the prior art.
Figure 9:
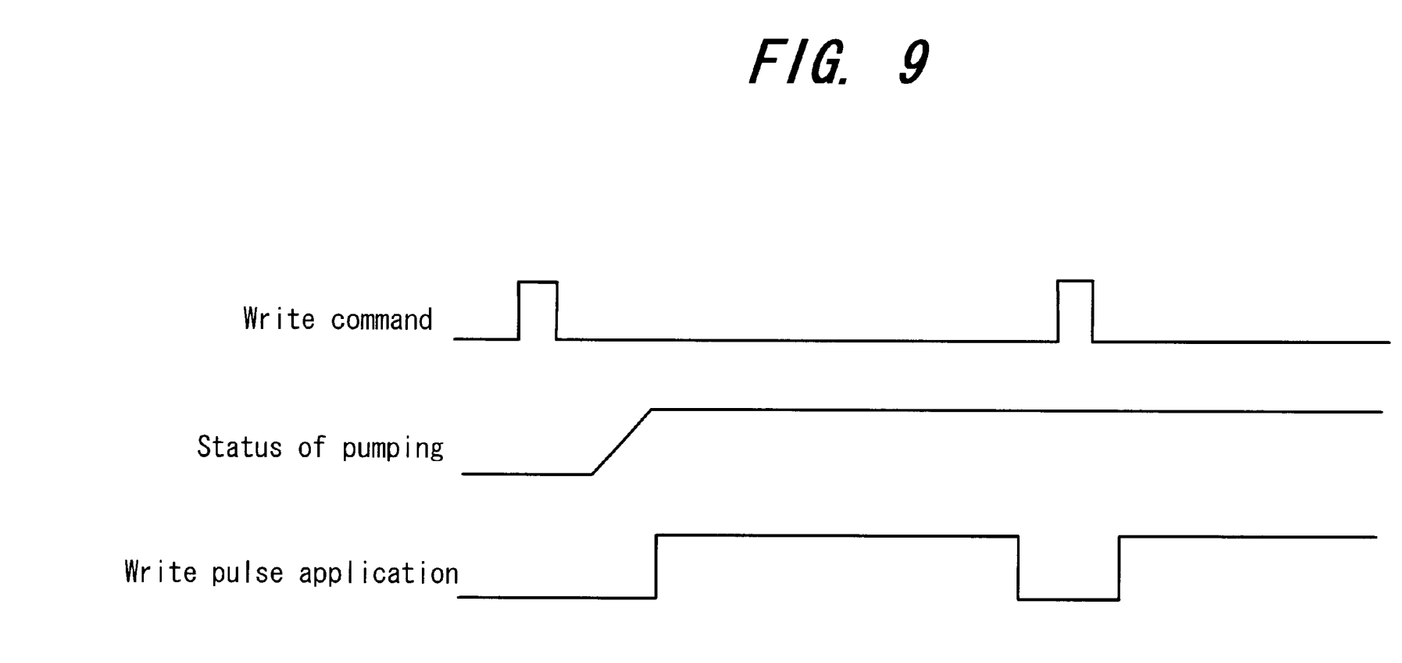
FIG. 9 is a timing chart when write operations of data are performed in succession to a nonvolatile memory array, in the embodiment of the present invention.

Next, the timing chart when successive write operations of data are implemented in the embodiments described heretofore is shown in FIG. 9 while the timing chart when successive write operations of data are implemented in the prior art is shown in FIG. 8.

As is apparent from FIGS. 8 and 9, in the nonvolatile semiconductor storage device according to the embodiment of the present invention, times t1 and t2 in FIG. 8, required for deactivation and activation of pumping in internal charge pump circuit 30 can be cut down compared to the case of successive write operations in the prior art.

For example, typical values of t1 and 52 are about 30 ns and about 3.5 μs, respectively. Hence, according to the nonvolatile semiconductor storage device of the embodiment of the present invention, the time can be reduced by about 3.53 μs. The time required for one write operation is about 18 μs, therefore, use of the nonvolatile semiconductor storage device of the embodiment of the present invention makes it possible to reduce the time per write operation by about 20% when write operations are implemented in succession.

Though description of the above embodiments was made referring to the case of successive write commands being input, when erase commands are input in succession, needless to say, almost the same configurations can be adopted except in that the pumping voltage required for erase operations differs from that for write operations.

However, it should be noted that one write operation takes up to about 18 μs whereas one erase operation takes up to about 1.5 sec. Therefore, since the time required for erase operation is longer than that for write operation, the present invention is able to produce a more conspicuous time reduction effect when applied to successive write operations.

Since the nonvolatile semiconductor storage device and its control method of the present invention are thus configured, it is possible to cut down the time required for preparation for pumping from the initial condition and time required for return to the initial condition when operations of data writing or erasing in the nonvolatile memory cell array are implemented in succession.

Therefore, it is possible to reduce the time for writing and erasing. This time reduction effect will be more conspicuous the more the number of commands being input in succession increases. The effect becomes more obvious the lower the power voltage is, since a longer time is required for pumping.

Moreover, when successive data writing or erasing operations are implemented on the nonvolatile memory cell array, it is possible to omit all the preparation for pumping from the initial condition. Therefore, it is possible to cut down the power consumption of current passing through capacitors, etc. which would have been uselessly consumed for the pumping preparation in the conventional configuration. As a result, the present invention is able to make a great contribution to reducing power consumption.

What is claimed is:

1. A nonvolatile semiconductor storage device comprising:
   a memory cell array made up of a multiple number of nonvolatile memory cells;
   a charge pump circuit for, when activated, generating voltages for data writing and erasing of memory cells;
   a command user interface for interpreting a command externally input and generating a signal instructing execution of the command; and a write and erase control circuit which receives the signal from the command user interface and controls a series of internal operations constituting writing and erasing of data in the memory cell array so as to supply the voltage generated by the charge pump circuit to the memory cell array, characterized in that the command user interface includes a successive command input detecting means for detecting the successive inputs of commands of the same type, and when the successive command input detecting means detects commands of the same type in succession, the write and erase control circuit functions so as to control the internal operations by skipping a part of the sequence of the internal operations constituting the input, first command operation in which the charge pump circuit would be deactivated and starting execution of the second command before the first command has been completed, with the charge pump already activated due to execution of the input, first command operation.

2. The nonvolatile semiconductor storage device according to claim 1, wherein the successive command input detecting means of the command user interface comprises: a storage means for storing the type of an input command; a comparing means for comparing the type of a command input next to that of the stored command; and an output means for outputting the comparison result in the comparing means.

3. The nonvolatile semiconductor storage device according to claim 1, wherein the externally input commands are made up of multiple cycles, and comparison by the command user interface between the first and second commands as to command type is carried out during the first cycle of the second command.

4. The nonvolatile semiconductor storage device according to claim 2, wherein the externally input commands are made up of multiple cycles, and comparison by the command user interface between the first and second commands as to command type is carried out during the first cycle of the second command.

5. A control method of a nonvolatile semiconductor storage device comprising: a memory cell array made up of a multiple number of nonvolatile memory cells; a charge pump circuit for generating voltages for data writing and erasing of memory cells; a command user interface for interpreting a command externally input and generating a signal instructing execution of the command; and a write and erase control circuit which receives the signal from the command user interface and controls a series of internal operations constituting writing and erasing of data in the memory cell array so as to supply the voltage generated by the charge pump circuit to the memory cell array, wherein the command user interface includes a successive command input detecting means for detecting the successive inputs of commands of the same type, and when the successive command input detecting means detects commands of the same type in succession, the write and erase control circuit functions so as to control the internal operations by skipping part of the sequence of the internal operations constituting the input, first command operation and starting execution of the second command before the first command has been completed, the control method comprising:

the first step of activating the charge pump circuit for pumping the output voltage therefrom to a predetermined voltage;

the second step of setting the threshold voltage of the memory cell transistor at a predetermined level, by applying the pumping voltage generated at the first step; and the third step of deactivating the operation of the charge pump circuit so as to restore the output voltage to the initial state, characterized in that when the second command being input during implementation of the first command is of the same type as that of the first command, the second step of the execution of the second command is started following the end of the second step of the execution of the first command.

6. A nonvolatile semiconductor storage device comprising:

a memory cell array made up of a multiple number of nonvolatile memory cells;

a charge pump circuit for generating voltages for data writing and erasing of memory cells;

a command user interface for interpreting a command externally input and generating a signal instructing execution of the command;

a write and erase control circuit which receives the signal from the command user interface and controls a series of internal operations constituting writing and erasing of data in the memory cell array so as to supply the voltage generated by the charge pump circuit to the memory cell array; and a means for receiving a successive operation control signal which indicates that a command of the same type as that of the preceding command has been externally input in succession, characterized in that the write and erase control circuit distinguishes the status of the successive operation control signal, and when the successive operation control signal is active, the write and erase control circuit functions so as to control the internal operations by skipping a part of the sequence of the internal operations constituting the input, first command operation in which the charge pump circuit would be deactivated and starting execution of the second and following commands input in succession before the preceding command has been completed, with the charge pump already activated.

7. The nonvolatile semiconductor storage device according to claim 6, further comprising a dedicated external terminal through which the successive operation control signal is supplied.

8. The nonvolatile semiconductor storage device according to claim 6, further comprising a means for generating the successive operation control signal from the chip-select signal input externally.

9. A control method of a nonvolatile semiconductor storage device comprising: a memory cell array made up of a multiple number of nonvolatile memory cells; a charge pump circuit for generating voltages for data writing and erasing of memory cells; a command user interface for interpreting a command externally input and generating a signal instructing execution of the command; a write and erase control circuit which receives the signal from the command user interface and controls a series of internal operations constituting writing and erasing of data in the memory cell array so as to supply the voltage generated by the charge pump circuit to the memory cell array; and a means for receiving a successive operation control signal which indicates that a command of the same type as that of the preceding command has been externally input in succession, wherein the write and erase control circuit distinguishes the status of the successive operation control signal, and when the successive operation control signal is active, the write and erase control circuit functions so as to control the internal operations by skipping part of the sequence of the internal operations constituting the input, first command operation and starting execution of the second command and following commands input in succession before the preceding command has been completed, the control method comprising:
the first step of activating the charge pump circuit to pumping the output voltage therefrom to a predetermined voltage;
the second step of setting a threshold voltage of the memory cell transistor at the predetermined level, by applying the pumping voltage generated at the first step;
the third step of deactivating the operation of the charge pump circuit so as to restore the output voltage to the initial state,
characterized in that when the successive operation control signal is active, the second step of the execution of the second command is started following the end of the second step of the execution of the first command.

10. A nonvolatile semiconductor storage device comprising:
a memory cell array made up of a multiple number of nonvolatile memory cells;
a charge pump circuit for, when activated, generating voltages for data writing and erasing of memory cells;
a command user interface for interpreting a command externally input and generating a signal instructing execution of the command;
a write and erase control circuit which receives the signal from the command user interface and controls a series of internal operations constituting writing and erasing of data in the memory cell array so as to supply the voltage generated by the charge pump circuit to the memory cell array; and
a timer circuit,
characterized in that the write and erase control circuit has the function of setting the count time in the timer circuit and controlling the count start, and the timer circuit has the function of controlling the activation and deactivation of the operation of the charge pump circuit and wherein the timer circuit is configured such that, when successive commands of the same type are input, the charge pump circuit is not deactivated after execution of a first command such that the charge pump circuit does not need to be activated to execute a second command succeeding the first command.

11. The nonvolatile semiconductor storage device according to claim 10, wherein in the timer circuit the count time of waiting for a command of the same type to be externally input in succession can be adjusted arbitrarily.

12. A control method of a nonvolatile semiconductor storage device comprising: a memory cell array made up of a multiple number of nonvolatile memory cells; a charge pump circuit for generating voltages for data writing and erasing of memory cells; a command user interface for interpreting a command externally input and generating a signal instructing execution of the command; a write and erase control circuit which receives the signal from the command user interface and controls a series of internal operations constituting writing and erasing of data in the memory cell array so as to supply the voltage generated by the charge pump circuit to the memory cell array; and a timer circuit, wherein the write and erase control circuit has the function of setting the count time in the timer circuit and controlling the count start, and the timer circuit has the function of controlling the activation and deactivation of the operation of the charge pump circuit, the control method comprising:
the first step of activating the charge pump circuit for pumping the output voltage therefrom to a predetermined voltage;
the second step of setting the threshold voltage of the memory cell transistor at a predetermined level, by applying the pumping voltage generated at the first step; and
the third step of deactivating the operation of the charge pump circuit so as to restore the output voltage to the initial state,
characterized in that when the second command is input while the timer circuit, which starts counting from the end of the second step of the execution of the first command, is counting up to the predetermined count time, the second step of the execution of the second command is started following the end of the second step of the execution of the first command.

* * * * *